(12) United States Patent
Lee

(10) Patent No.: US 8,222,586 B2
(45) Date of Patent: Jul. 17, 2012

(54) 3 TRANSISTORS 4 SHARED STEP AND REPEAT UNIT CELL AND 3 TRANSISTORS 4 SHARED IMAGE SENSOR INCLUDING THE UNIT CELLS

(75) Inventor: Do-Young Lee, Seongnam-si (KR)

(73) Assignee: Siliconfile Technologies Inc., Seoul (KR)

(*) Notice: Subject to any disclaimer, the term of this patent is extended or adjusted under 35 U.S.C. 154(b) by 442 days.

(21) Appl. No.: 12/520,091

(22) PCT Filed: Dec. 18, 2007

(86) PCT No.: PCT/KR2007/006622
§ 371 (c)(1),
(2), (4) Date: Nov. 30, 2009

(87) PCT Pub. No.: WO2008/075874
PCT Pub. Date: Jun. 26, 2008

(65) Prior Publication Data
US 2010/0200729 A1    Aug. 12, 2010

(30) Foreign Application Priority Data
Dec. 19, 2006  (KR) .......................... 10-2006-0129977

(51) Int. Cl.
*H04N 3/14* (2006.01)
*H04N 5/335* (2011.01)
(52) U.S. Cl. ........................ 250/208.1; 348/302; 257/291
(58) Field of Classification Search ............... 250/208.1, 250/214.1, 214 R; 348/294, 302; 257/291, 257/292, 443
See application file for complete search history.

(56) References Cited

U.S. PATENT DOCUMENTS
7,030,357 B2 * 4/2006 Lee .......................... 250/208.1
(Continued)

FOREIGN PATENT DOCUMENTS
EP    1703564 A2    9/2006

OTHER PUBLICATIONS
International Search Report of International Application No. PCT/KR2007/006622 filed on Dec. 18, 2007.
(Continued)

*Primary Examiner* — Seung C Sohn
(74) *Attorney, Agent, or Firm* — Kile Park Goekjian Reed & McManus PLLC

(57) ABSTRACT

A 3T-4S step & repeat unit cell obtained by combining four image sensor unit cells each including three transistors and a 3T-4S image sensor including the 3T-4S step & repeat unit cell are provided. The 3T-4S step & repeat unit cell includes first to fourth photodiodes. A first shared image sensor unit cell is obtained by combining the first and second photodiodes with four transistors. A second shared image sensor unit cell is obtained by combining the third and fourth photodiodes with four transistors. Signals corresponding to images incident onto the first and second photodiodes are output through a first common detection line. Signals corresponding to images incident onto the third and fourth photodiodes are output through a second common detection line. A terminal of each of the four photodiodes is connected to a first voltage source. Conversion voltages corresponding to image signals incident onto two photodiodes via green filters are output through a common detection line. Conversion voltages corresponding to image signals incident onto the other two photodiodes via red and blue filters are output through another common detection line.

20 Claims, 8 Drawing Sheets

U.S. PATENT DOCUMENTS

| | | |
|---|---|---|
| 8,115,155 B2 * | 2/2012 | Lee .............................. 250/208.1 |
| 2006/0082668 A1 | 4/2006 | Inoue et al. |
| 2006/0084195 A1 * | 4/2006 | Lyu ................................. 438/48 |
| 2006/0132633 A1 * | 6/2006 | Nam et al. ..................... 348/308 |
| 2006/0192261 A1 * | 8/2006 | Sze et al. ....................... 257/431 |
| 2006/0284051 A1 | 12/2006 | Ko et al. |
| 2007/0091190 A1 * | 4/2007 | Iwabuchi et al. ............. 348/294 |

OTHER PUBLICATIONS

Written Opinion of the International Application No. PCT/KR2007/006622 filed on Dec. 18, 2007.

* cited by examiner

[Fig. 1]
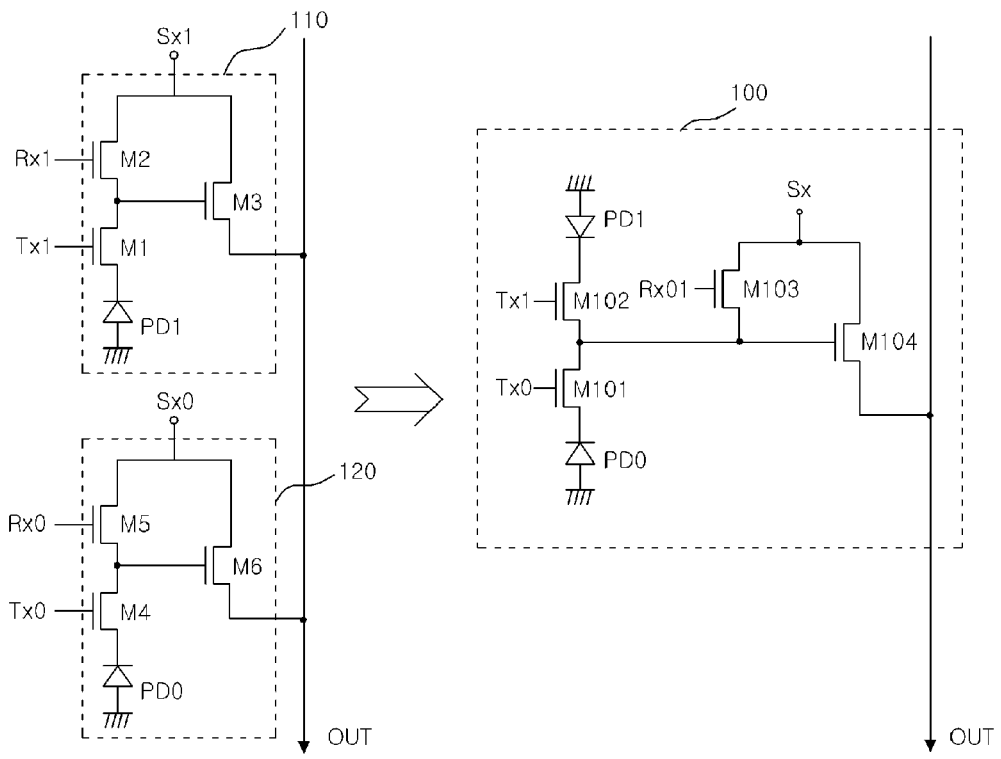
[Fig. 2]
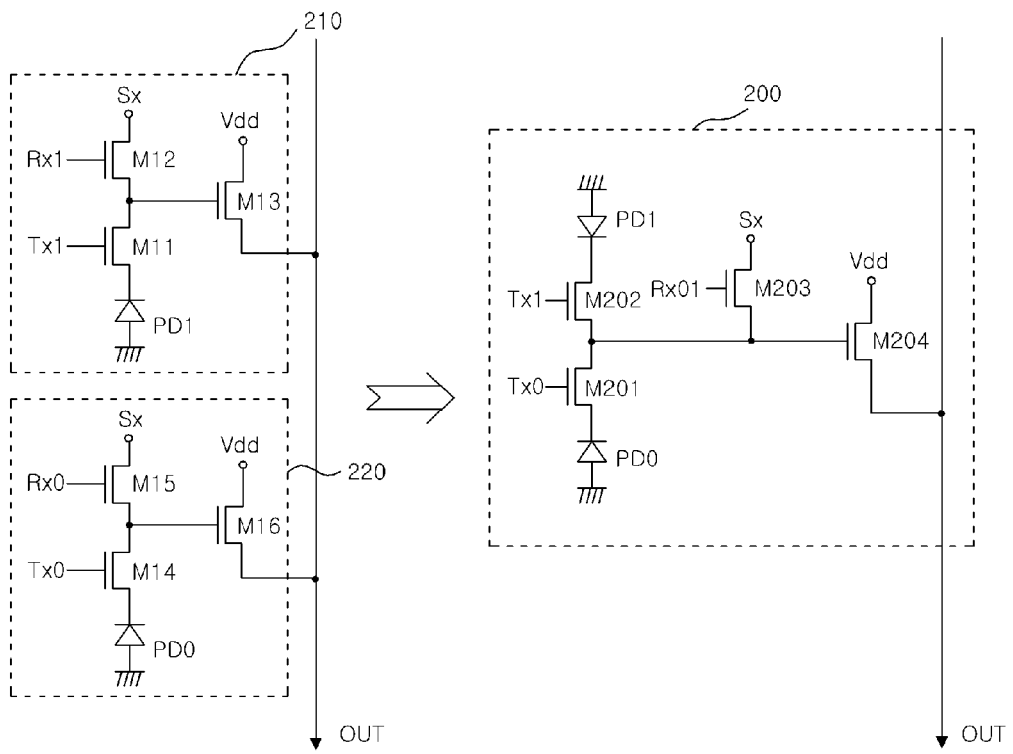

[Fig. 3]
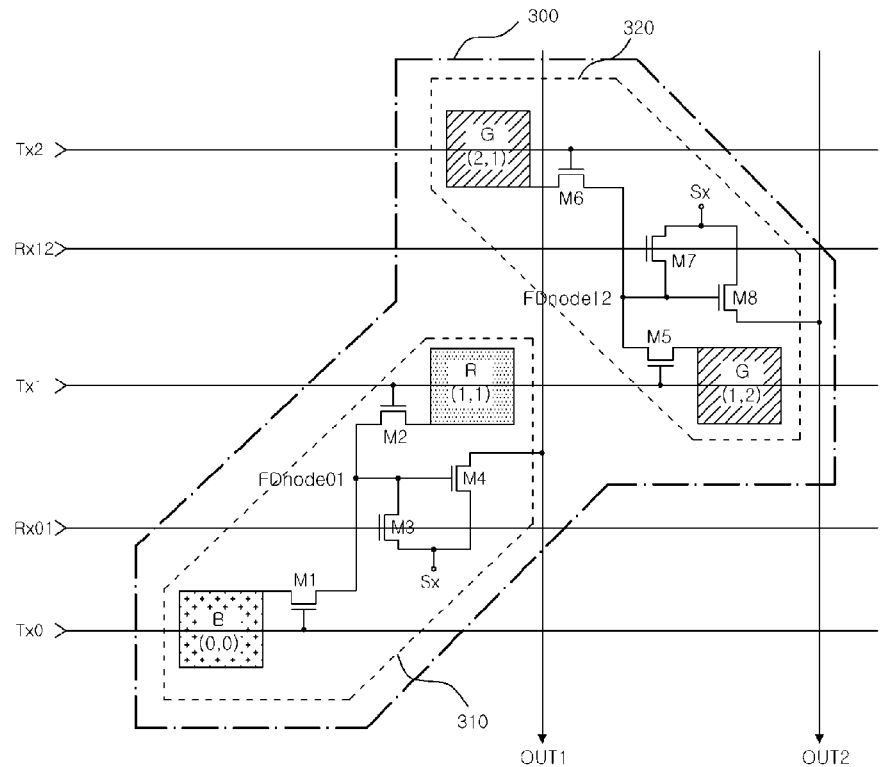
[Fig. 4]
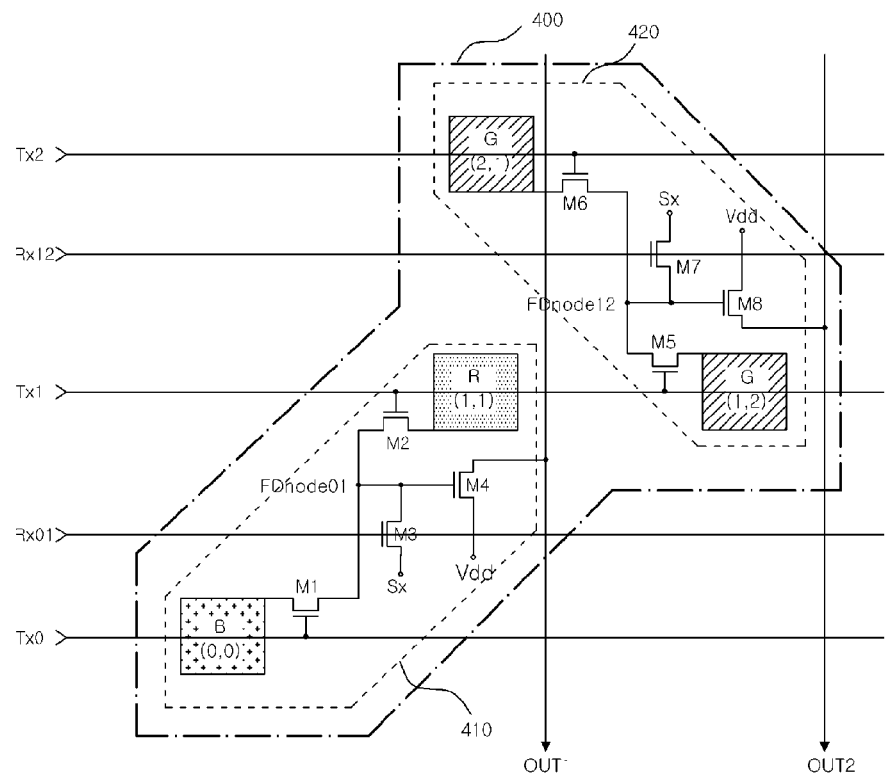

[Fig. 5]
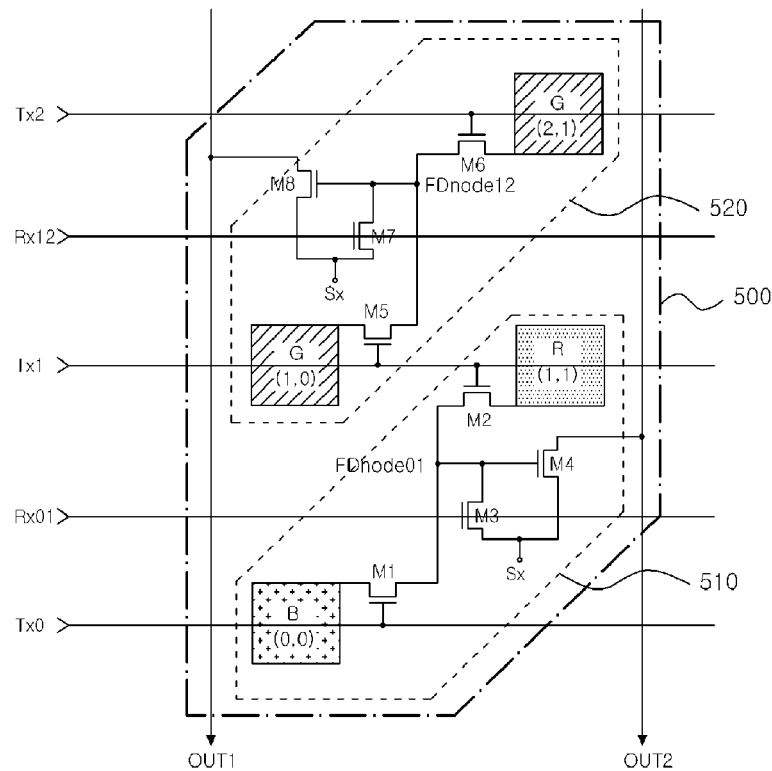
[Fig. 6]
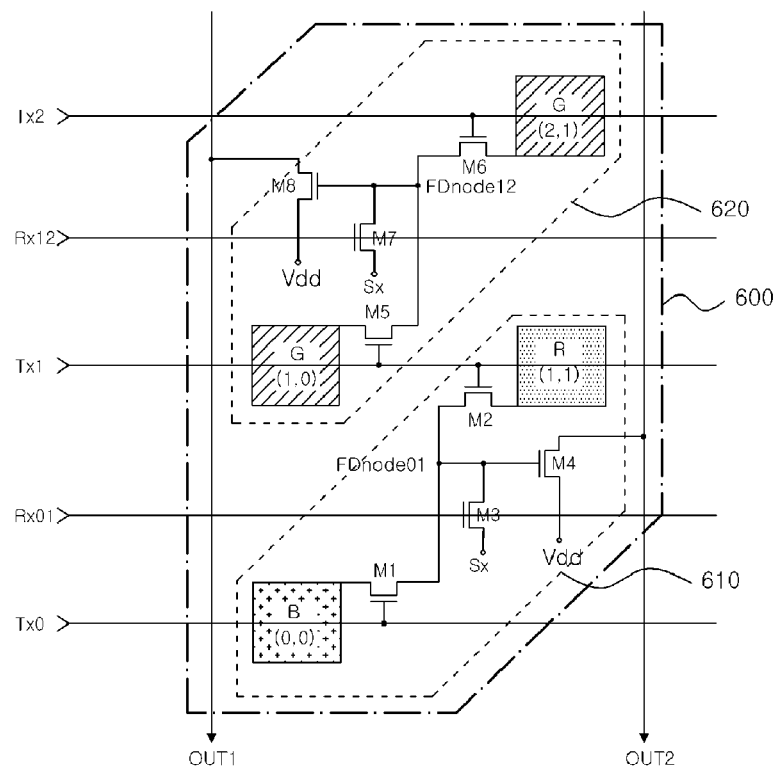

[Fig. 7]
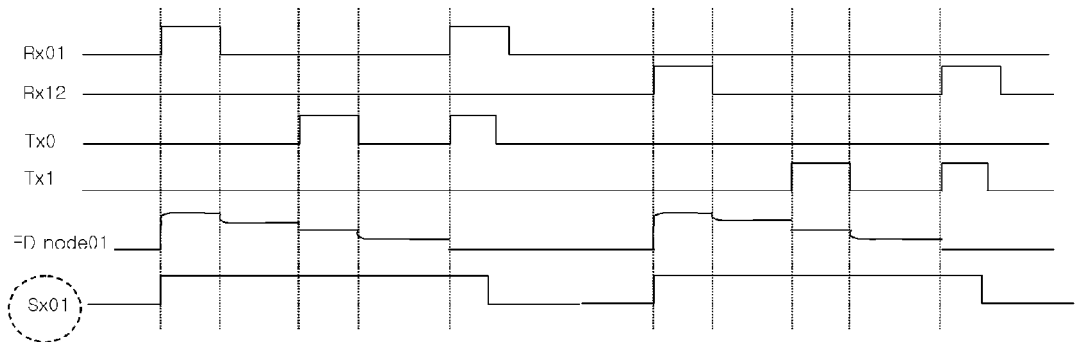
[Fig. 8]
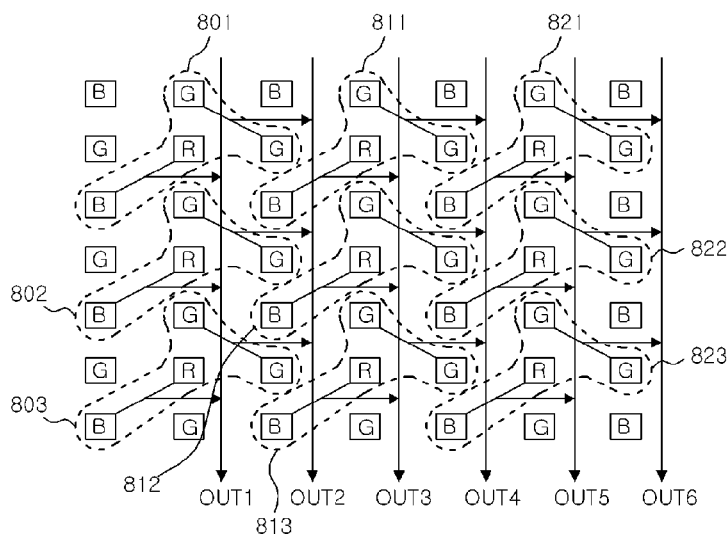
[Fig. 9]
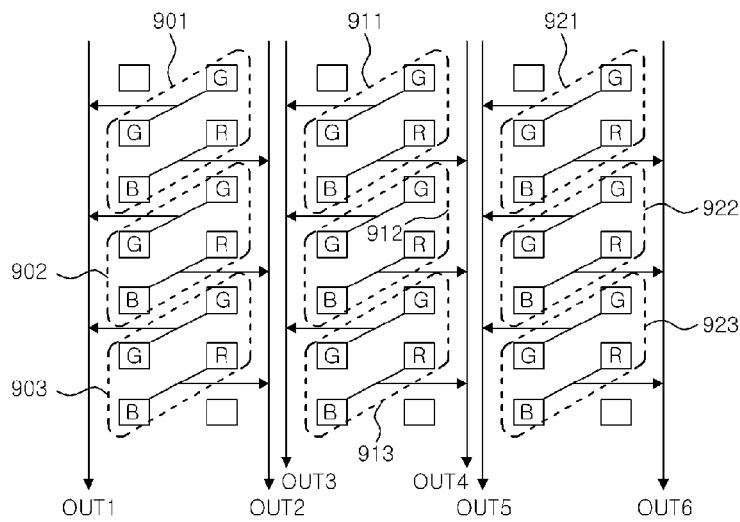

[Fig. 10]
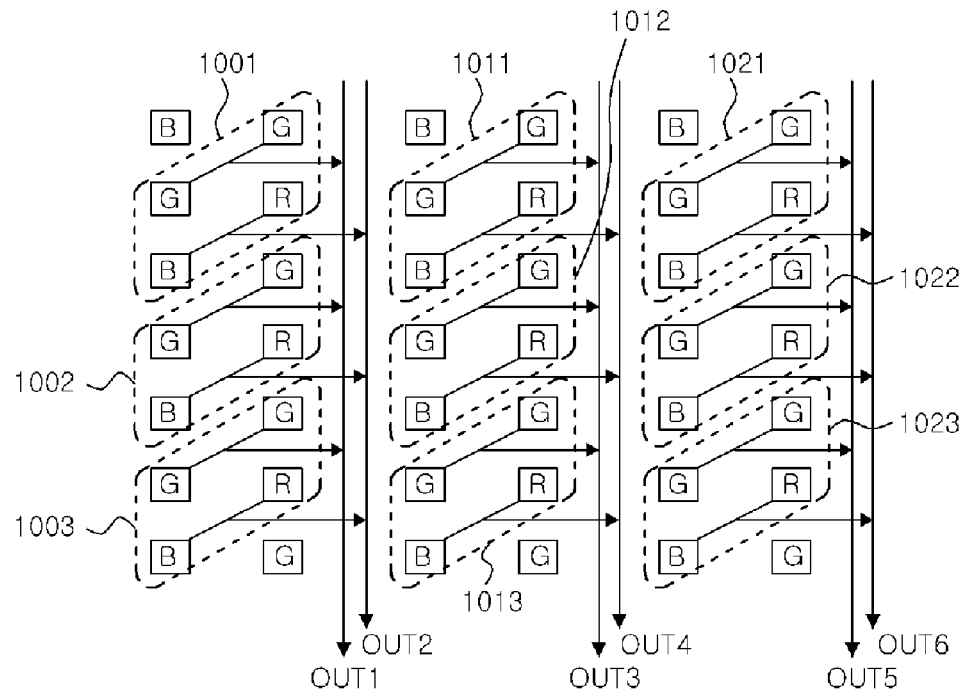
[Fig. 11]
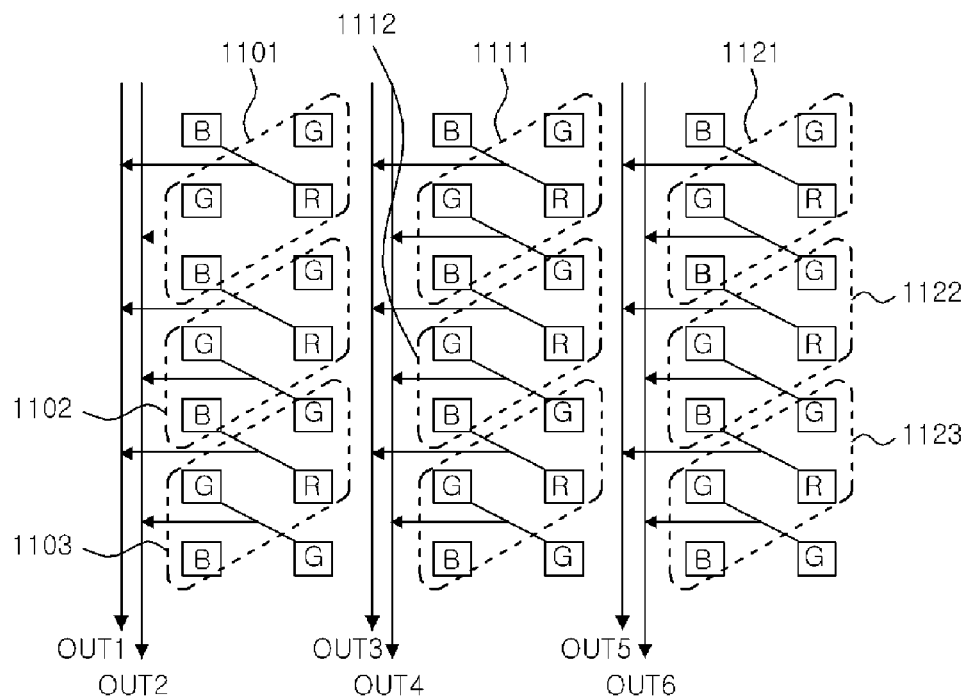

[Fig. 12]
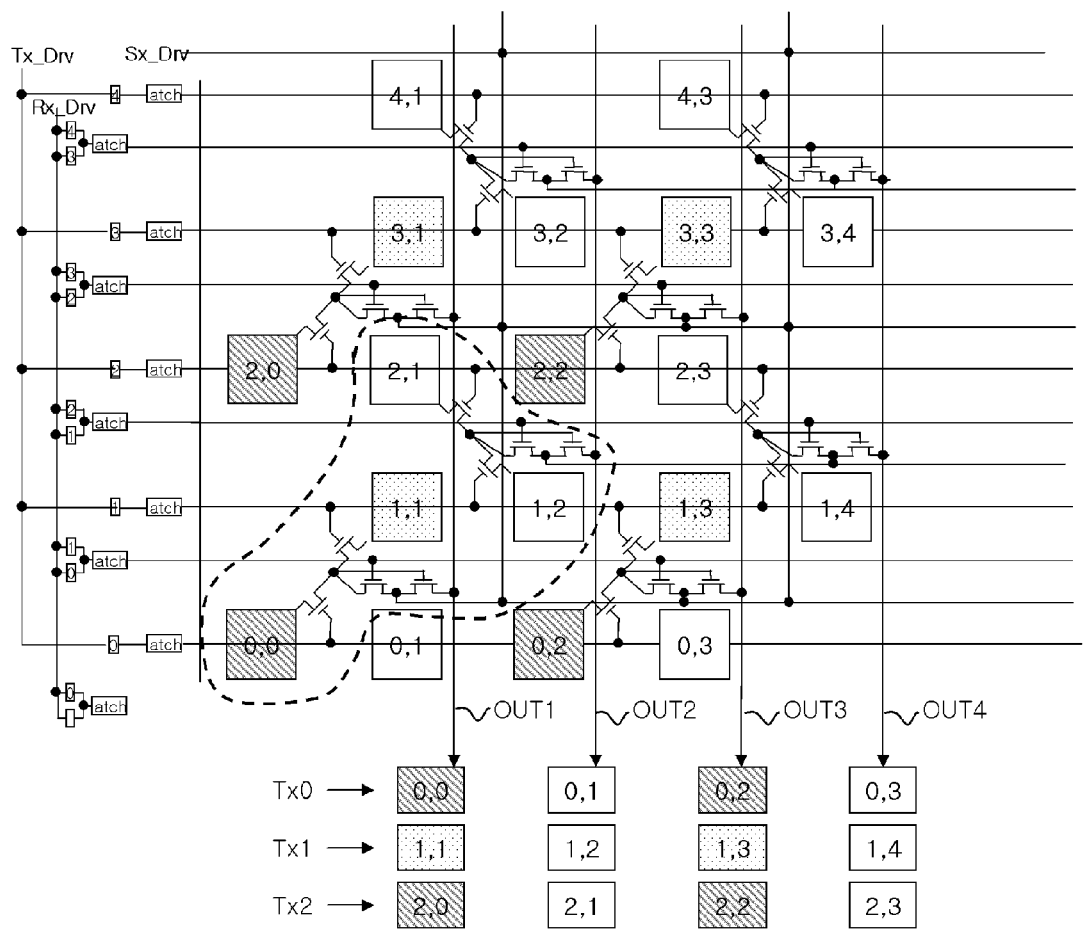

[Fig. 13]
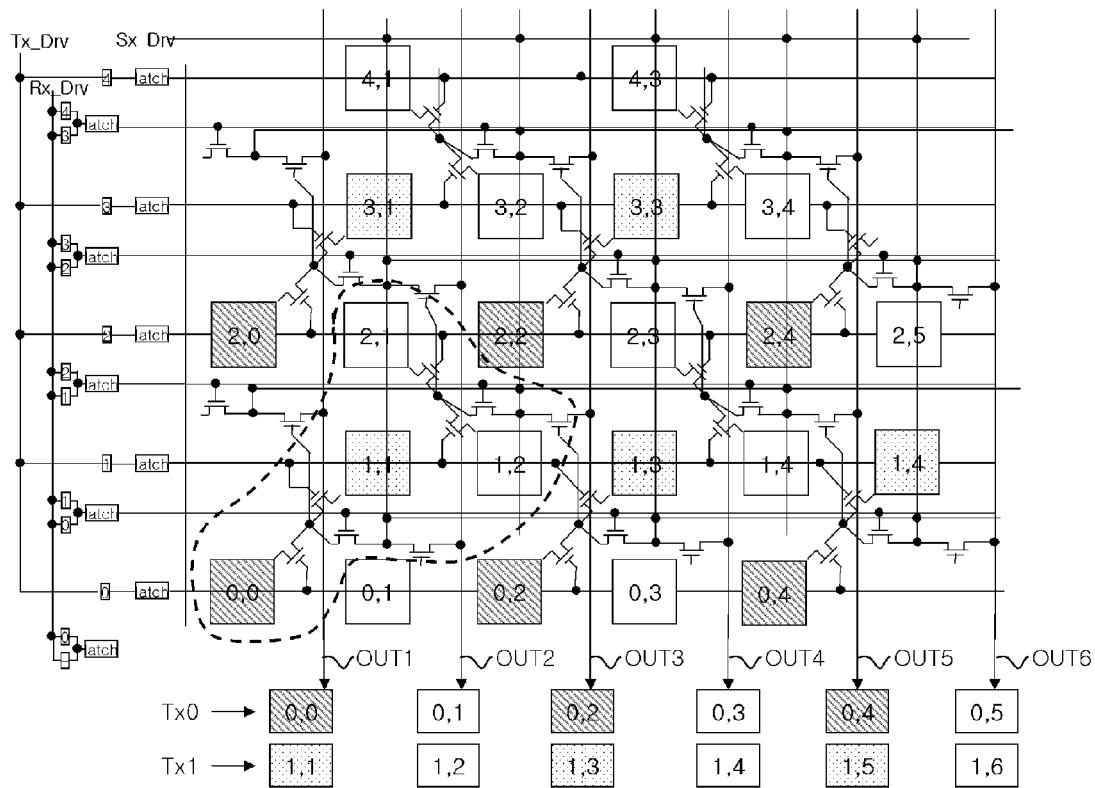
[Fig. 14]
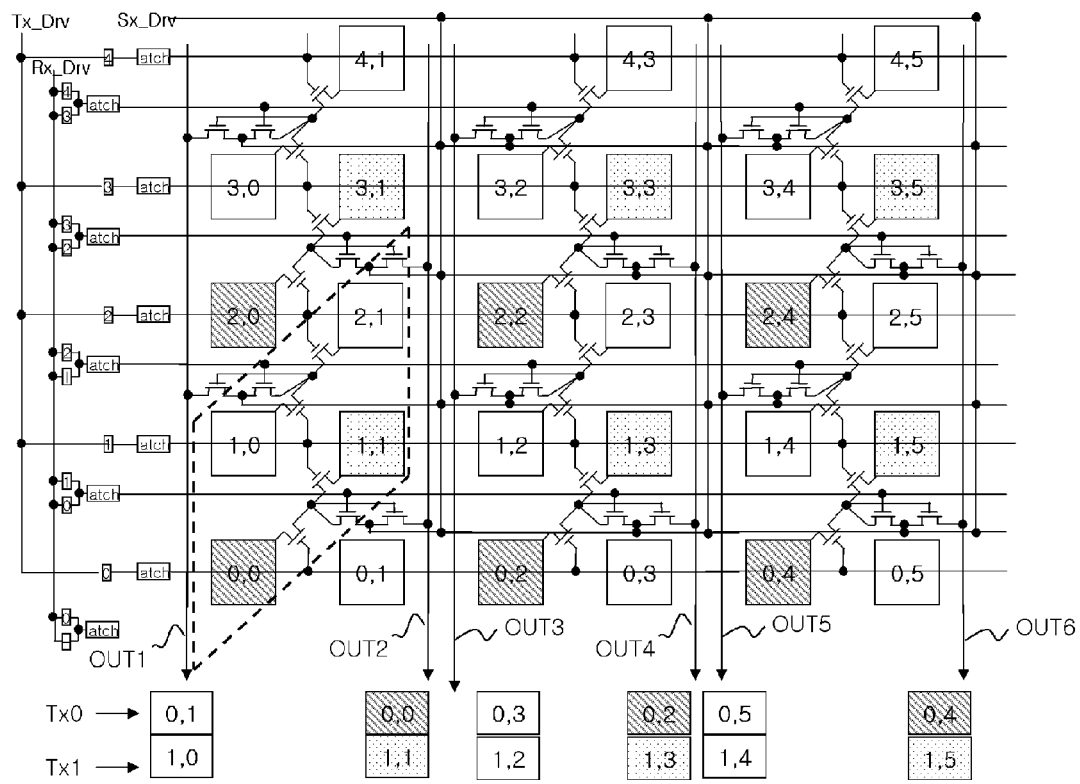

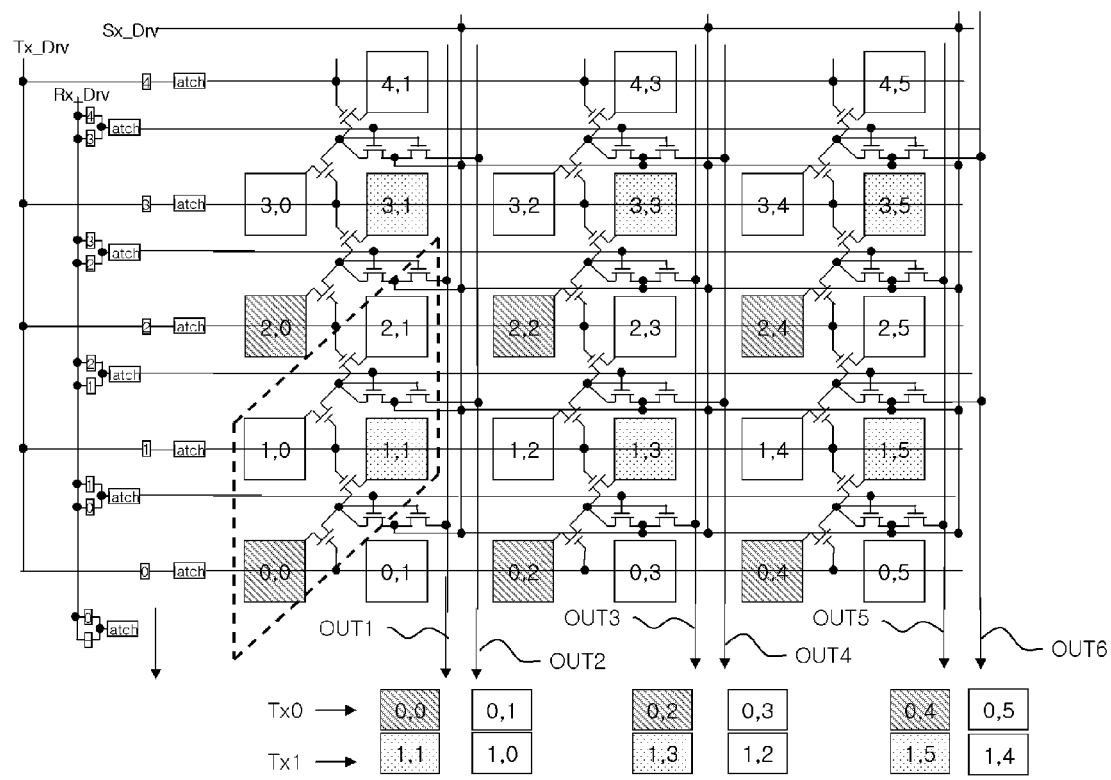
[Fig. 15]

3 TRANSISTORS 4 SHARED STEP AND REPEAT UNIT CELL AND 3 TRANSISTORS 4 SHARED IMAGE SENSOR INCLUDING THE UNIT CELLS

TECHNICAL FIELD

The present invention relates to an image sensor, and more particularly, to a 3T-4S step & repeat unit cell obtained by combining four image sensor unit cells each including three transistors.

BACKGROUND ART

FIG. 1 illustrates a 3T-2S image sensor circuit obtained by combining two first-type image sensor circuits each including three transistors.

Referring to FIG. 1, a 3T-2S image sensor circuit 100 is obtained by combining two image sensor unit cells 110 and 120 each including three transistors. The 3T-2S image sensor includes two photodiodes PD0 and PD1 and four transistors M101 to M104. In the 3T-2S image sensor circuit 100, reset transistors M2 and M5 and conversion transistors M3 and M6 are shared by the two image sensor circuits 110 and 120 each including three transistors. The 3T-2S image sensor circuit 100 uses two transistors M103 and M104 commonly used for reset and conversion operations and two transmission transistors M101 and M102 respectively connected to the two photodiodes PD0 and PD1.

Here, since a reset signal Rx01 applied to a gate of the reset transistor M103 is enabled when one of two charge transmission control signals Tx0 and Tx1 respectively applied to gates of the transmission transistors M101 and M102 is enabled, the reset signal Rx01 is denoted by using '01 (zero and one)'. A selection signal Sx is enabled in response to the two charge transmission control signals Tx0 and Tx1, respectively.

FIG. 2 illustrates a 3T-2S image sensor circuit obtained by combining two second-type image sensor circuits each including three transistors.

Referring to FIG. 2, a 3T-2S image sensor circuit 200 is obtained by combining two image sensor unit cells 210 and 220 each including three transistors. The 3T-2S image sensor includes two photodiodes PD0 and PD1 and four transistors M201 to M204. Reset transistors M12 and M15 and conversion transistors M13 and M16 are shared by two image sensor circuits 210 and 220 each including three transistors. The 3T-2S image sensor circuit 200 senses and transmits electric charges corresponding to image signals generated by the two photodiodes PD0 and PD1 by using two shared transistors M203 and M204 and the two transmission transistors M201 and M202.

In FIG. 1, a terminal of the reset transistor M103 and a terminal of the conversion transistor M104 are connected to a selection signal Sx. Unlike FIG. 1, in FIG. 2, a terminal of the reset transistor M203 is connected to the selection signal Sx, and a terminal of the conversion transistor M204 is connected to a voltage source Vdd.

As described, a single 3T-2S image sensor circuit obtained by combining two image sensor circuits each including three transistors may be laid out in various manners. However, a case where four image sensor circuits combined in a single unit cell has not been particularly published.

DISCLOSURE OF INVENTION

Technical Problem

The present invention provides a 3T-4S step & repeat unit cell obtained by combining four image sensor unit cells each including three transistors.

The present invention also provides a 3T-4S image sensor including a plurality of 3T-4S step & repeat unit cells obtained by combining four image sensor unit cells each including three transistors.

Technical Solution

According to a first aspect of the present invention, there is provided a 3T-4S step & repeat unit cell comprising: a first photodiode; a second photodiode disposed in a diagonal direction of the first photodiode; a third photodiode disposed at a side of the second photodiode; and a fourth photodiode disposed over the second photodiode, wherein a first shared image sensor unit cell is constructed by combining the first and second photodiodes with four transistors, and a second shared image sensor unit cell is constructed by combining the third and fourth photodiodes with four transistors, and wherein signals corresponding to images incident onto the first and second photodiodes are output through a first common detection line OUT1, signals corresponding to images incident onto the third and fourth photodiodes are output through a second common detection line OUT2, and a terminal of each of the four photodiodes is connected to a first voltage source.

According to a second aspect of the present invention, there is provided a 3T-4S step & repeat unit cell comprising: a first photodiode; a second photodiode disposed over the first photodiode; a third photodiode disposed at a side of the second photodiode; and a fourth photodiode disposed over the third photodiode, wherein a first shared image sensor unit cell is constructed by combining the first and third photodiodes with four transistors, and a second shared image sensor unit cell is constructed by combining the second and fourth photodiodes with four transistors, and wherein signals corresponding to images incident onto the second and fourth photodiodes are output through a first common detection line OUT1, signals corresponding to images incident onto the first and third photodiodes are output through a second common detection line OUT2, and a terminal of each of the four photodiodes is connected to a first voltage source.

According to a third aspect of the present invention, there is provided a 3T-4S image sensor in which a plurality of the 3T-4S step & repeat unit cells according to the first aspect are two-dimensionally arranged, wherein a plurality of common detection lines are vertically or horizontally arranged between neighboring 3T-4S step & repeat unit cells among the two-dimensionally arranged plurality of 3T-4S step & repeat unit cells, and wherein the plurality of 3T-4S step & repeat unit cells arranged along the plurality of common detection lines output conversion voltages corresponding to image signals incident onto photodiodes through two neighboring common detection lines.

According to a fourth aspect of the present invention, there is provided a 3T-4S image sensor in which a plurality of the 3T-4S step & repeat unit cells according to the second aspect are two-dimensionally arranged, wherein a plurality of common detection lines are vertically or horizontally arranged between neighboring 3T-4S step & repeat unit cells among the two-dimensionally arranged plurality of 3T-4S step & repeat unit cells, and wherein the plurality of 3T-4S step & repeat unit cells arranged along the plurality of common detection lines output conversion voltages corresponding to image signals incident onto photodiodes through two neighboring common detection lines.

BRIEF DESCRIPTION OF THE DRAWINGS

The above and other features and advantages of the present invention will become more apparent by describing in detail exemplary embodiments thereof with reference to the attached drawings in which:

FIG. 1 illustrates a 3T-2S image sensor circuit obtained by combining two first-type image sensor circuits each including three transistors;

FIG. 2 illustrates a 3T-2S image sensor circuit obtained by combining two second-type image sensor circuits each including three transistors;

FIG. 3 illustrates a 3T-4S step & repeat unit cell according to a first embodiment of the present invention;

FIG. 4 illustrates a 3T-4S step & repeat unit cell according to a second embodiment of the present invention;

FIG. 5 illustrates a 3T-4S step & repeat unit cell according to a third embodiment of the present invention;

FIG. 6 illustrates a 3T-4S step & repeat unit cell according to a fourth embodiment of the present invention;

FIG. 7 is a timing diagram illustrating signals used for a first shared image sensor unit cell 310 shown in FIG. 3;

FIG. 8 is a schematic diagram illustrating an image sensor according to a first embodiment of the present invention;

FIG. 9 is a schematic diagram illustrating an image sensor according to a second embodiment of the present invention;

FIG. 10 is a schematic diagram illustrating an image sensor according to a third embodiment of the present invention;

FIG. 11 is a schematic diagram illustrating an image sensor according to a fourth embodiment of the present invention;

FIG. 12 is a practical circuit diagram illustrating the image sensor shown in FIG. 8;

FIG. 13 illustrates an application of the image sensor shown in FIG. 8;

FIG. 14 is a practical circuit diagram illustrating the image sensor shown in FIGS. 9; and FIG. 15 is a practical circuit diagram illustrating the image sensor shown in FIG. 10;

BEST MODE FOR CARRYING OUT THE INVENTION

Hereinafter, the present invention will be described in detail with reference to accompanying drawings.

When a given circuit is laid out, predetermined unit cells may be repeated arranged.

In this case, the unit cells are arranged in a step & repeat manner. This indicates that the unit cells are successively arranged in horizontal and vertical directions. The term of a step & repeat manner to be used later includes the aforementioned description. Step & repeat unit cells indicate unit cells that are repeatedly arranged.

FIG. 3 illustrates a 3T-4S step & repeat unit cell according to a first embodiment of the present invention.

Referring to FIG. 3, a 3T-4S step & repeat unit cell 300 includes first and second shared image sensor unit cells 310 and 320.

The 3T-4S step & repeat unit cell 300 includes a first photodiode (0, 0), a second photodiode (1, 1) disposed in a diagonal direction of the first photodiode (0, 0), a third photodiode (1, 2) disposed in the right side of the second photodiode (1, 1), and a fourth photodiode (2, 1) disposed over the second photodiode (1, 1). Although not shown, a terminal of each of the four photodiodes (0, 0) to (2, 1) is connected to a ground voltage (GND).

The first shared image sensor unit cell 310 includes two photodiodes (0, 0) and (1, 1) and four MOS transistors M1 to M4.

A first transmission transistor M1 has a terminal connected to the other terminal of the first photodiode (0, 0) and a gate applied with a first transmission signal Tx0. A second transmission transistor M2 has a terminal connected to the other terminal of the second photodiode (1, 1) and a gate applied with a second transmission signal Tx1. A first reset transistor M3 has a terminal connected to a common node FDnode01 of the other terminal of the first transmission transistor M1 and the other terminal of the second transmission transistor M2, the other terminal connected to a selection signal Sx, and a gate applied with a 01-reset signal Rx01. A first conversion transistor M4 has a terminal connected to the selection signal Sx, the other terminal connected to a first common detection line OUT1, and a gate connected to the common node FDnode01.

The second shared image sensor unit cell 320 includes two photodiodes (1, 2) and (2, 1) and four MOS transistors M5 to M8.

A third transmission transistor M5 has a terminal connected to the other terminal of the third photodiode (1, 2) and a gate applied with the second transmission signal Tx1. A fourth transmission transistor M6 has a terminal connected to the other terminal of the fourth photodiode (2, 1) and a gate applied with a third transmission signal Tx2. A second reset transistor M7 has a terminal connected to a common node FDnode12 of the other terminal of the third transmission transistor M5 and the other terminal of the fourth transmission transistor M6, the other terminal connected to the selection signal Sx, and a gate applied with a 12-reset signal Rx12. A second conversion transistor M8 has a terminal connected to the selection signal Sx, the other terminal connected to a second common detection line OUT2, and a gate connected to the common node FDnode12.

FIG. 4 illustrates a 3T-4S step & repeat unit cell according to a second embodiment of the present invention.

Referring to FIG. 4, a 3T-4S step & repeat unit cell 400 is the same as the 3T-4S step & repeat unit cell 300 shown in FIG. 3 except connection of a terminal of each of the conversion transistors M4 and M8. The first and second shared image sensor unit cells 310 and 320 correspond to first and second shared image sensor unit cells 410 and 420.

In FIG. 3, a terminal of each of the two conversion transistors M4 and M8 constituting the unit cell 300 is connected to the selection signal Sx. In FIG. 4, a terminal of each of the two conversion transistors M4 and M8 constituting the unit cell 400 is connected to a voltage source Vdd. Here, the voltage source Vdd is a voltage source having a high voltage level among voltage sources used to operate a system on which the unit cell 400 is mounted. In this case, a voltage level obtained when the selection signal Sx is enabled may have the same voltage level as the voltage source Vdd.

FIG. 5 illustrates a 3T-4S step & repeat unit cell according to a third embodiment of the present invention.

Referring to FIG. 5, a 3T-4S step & repeat unit cell 500 includes first and second shared image sensor unit cells 510 and 520.

The 3T-4S step & repeat unit cell 500 includes a first photodiode (0, 0), a second photodiode (1, 0) disposed over the first photodiode (0, 0), a third photodiode (1, 1) disposed in the right side of the second photodiode (1, 0), and a fourth photodiode (2, 1) disposed over the third photodiode (1, 1). Although not shown, a terminal of each of the four photodiodes (0, 0) to (2, 1) is connected to a ground voltage (GND).

The first shared image sensor unit cell 510 includes two photodiodes (0, 0) and (1, 1) and four MOS transistors M1 to M4.

A first transmission transistor M1 has a terminal connected to the other terminal of the photodiode (0, 0) and a gate applied with a first transmission signal Tx0. A second transmission transistor M2 has a terminal connected to the other terminal of the third photodiode (1, 1) and a gate applied with a second transmission signal Tx1. A first reset transistor M3 has a terminal connected to a common node FDnode01 of the other terminal of the first transmission transistor M1 and the other terminal of the second transmission transistor M2, the other terminal connected to a selection signal Sx, and a gate applied with a 01-reset signal Rx01. A first conversion transistor M4 has a terminal connected to the selection signal Sx, the other terminal to a second common detection line OUT2, and a gate connected to the common node FDnode01.

The second shared image sensor unit cell 520 includes two photodiodes (1, 0) and (2, 1) and four MOS transistors M5 and M8.

A third transmission transistor M5 has a terminal connected to the other terminal of the second photodiode (1, 0) and a gate applied with the second transmission signal Tx1. A fourth transmission transistor M6 has a terminal connected to the other terminal of the fourth photodiode (2, 1) and a gate applied with a third transmission signal Tx2. A second reset transistor M7 has a terminal connected to a common node FDnode12 of the other terminal of the third transmission transistor M5 and the other terminal of the fourth transmission transistor M6, the other terminal connected to the selection signal Sx, and a gate applied with a 12-reset signal Rx12. A second conversion transistor M8 has a terminal connected to the selection signal Sx, the other terminal connected to a first common detection line OUT1, and a gate connected to the common node FDnode12.

FIG. 6 illustrates a 3T-4S step & repeat unit cell according to a fourth embodiment of the present invention.

Referring to FIG. 6, a 3T-4S step & repeat unit cell 600 is the same as the 3T-4S step & repeat unit cell 500 shown in FIG. 5 except connection of a terminal of each of the conversion transistors. The first and second shred image sensor unit cells 510 and 520 correspond to first and second shared image sensor unit cells 610 and 620.

In case of the unit cell 500 shown in FIG. 5, a terminal of each of the two conversion transistors M4 and M8 is connected to the selection signal Sx. In case of the unit cell 600 shown in FIG. 6, a terminal of each of two conversion transistors M4 and M8 is connected to a voltage source Vdd. Here, the voltage source Vdd is a voltage source having a high voltage level among voltage sources used to operate a system on which the unit cell 600 is mounted.

FIG. 7 is a timing diagram illustrating signals used for the first shared image sensor unit cell 310 shown in FIG. 3.

Referring to FIG. 7, in order to output conversion voltages corresponding to image signals detected from the first and second photodiodes (0, 0) and (1, 1) through the first common detection line OUT1, the following processes are performed.

1) First, the selection signal Sx is enabled (for example, at a logical high state). At this time, the voltage level of the enabled selection signal Sx may have a voltage level of an operating voltage Vdd.

2) After the selection signal is at the high level, a voltage of the selection signal Sx applied via the first reset transistor M3 that is turned on in response to the 01-reset signal Rx01 resets the common node FDnode01.

3) Electric charges generated in correspondence with the image signal incident onto the first photodiode (0, 0) while performing procedures 1) and 2) are accumulated at the common terminal of the first photodiode (0, 0) and the first transmission transistor M1. The accumulated electric changes are transmitted to the common node FDnode01 via the first transmission transistor M1 for a time period for which the first transmission signal Tx0 is enabled at the high level after a predetermined time (exposure time). Since the common node FDnode01 is reset by the selection voltage having the same voltage level as the operating voltage Vdd, the voltage level at the common node FDnode01 decreases to a predetermined voltage level in correspondence with the transmitted electric charges. The first conversion transistor M4 generates a conversion voltage corresponding to the voltage level at the common node FDnode01 and outputs the conversion voltage through the first common detection line OUT1.

4) After the conversion voltage corresponding to the image signal detected from the first photodiode (0, 0) is sampled, the 01-reset signal Rx01 is enabled once more. At this time, the first transmission signal Tx0 is enabled. When the 01-reset signal Rx01 and the first transmission signal Tx0 are enabled, the voltage level of the selection signal Sx is changed to the ground voltage GND. Accordingly, the voltage level of the common node FDnode01 is reset to the ground voltage GND. After a predetermined time from when the voltage level of the common node FDnode01 is reset to the ground voltage, a procedure of outputting the conversion voltage corresponding to the image signal detected by the third photodiode (1, 1) through the first common detection line OUT1 starts. First, the selection signal is enabled at the high level, again.

5) After the selection signal Sx is at the high level, the selection signal Sx having the same voltage level as the operating voltage Vdd applied via the first reset transistor M3 that is turned on in response to the 01-reset signal Rx01 resets the common node FDnode01 to the voltage level of the operating voltage Vdd.

6) Electric charges generated in correspondence with the image signal incident onto the second photodiode (1, 1) while performing procedures 4) and 5) are accumulated at the common terminal of the second photodiode (1, 1) and the second transmission transistor M2. The accumulated electric changes are transmitted to the common node FDnode01 via the second transmission transistor M2 for a time period for which the second transmission signal Tx1 is enabled at the high level after a predetermined time (exposure time). Since the common node FDnode01 is reset to the voltage level of the operating voltage Vdd, the voltage level of the common node FDnode01 decreases to a predetermined voltage level in correspondence with the transmitted electric charges. The first conversion transistor M4 generates a conversion voltage corresponding to the voltage level of the common node FDnode01 and outputs the conversion voltage through the first common detection line OUT1. A procedure in which the voltage level of the selection signal Sx transitions to the ground voltage while the 01-reset signal Rx01 and the second transmission signal Tx2 are enabled once more is the same as the procedure of outputting the conversion signal corresponding to the image signal incident onto the first photodiode (0, 0).

Although only waveforms of signals used for the first shared image sensor unit cell 310 are shown, it is possible to describe the operation of the second shared image sensor unit cell 320 based on the aforementioned description.

That is, if in a part in which the operation of the first shared image sensor unit cell 310 is described, the third and fourth photodiodes (1, 2) and (2, 1) respectively replace the first and second photodiodes (0, 0) and (1, 1), the second and third transmission signals Tx1 and Tx2 respectively replace the first and second transmission signals Tx0 and Tx1, and the 12-reset signal Rx12 replaces the 01-reset signal Rx01, the operation of the first shared image sensor unit cell 310 is replaced by the operation of the second shared image sensor unit 320. Similarly, the common connection part FDnode01 of the first and second transmission transistors M1 and M2 will be replaced by the common connection part FDnode12 of the third and fourth transmission transistors M5 and M6.

In addition, although only a single unit cell 300 is described, since the 01-reset signal Rx01 covers zeroth and first lines and since the 12-reset signal Rx12 covers first and second lines, it is possible to deduce an image sensor that operates in units of line from the single unit cell 300. Similarly, it is possible to deduce the operation of the unit cells shown in FIGS. 4 to 6 from the single unit cell 300.

In the drawings, the selection signal Sx is a single signal. This is a case where a single selection signal Sx is applied to all the unit cells. When the number of selection signals is the same as that of the line, it is possible for the selection signals to be enabled in units of line. The common node (for example, FDnode01) of unit cells of a shared image sensor that outputs conversion voltages in response to two successive transmission signals is finally reset by the ground voltage GND. Accordingly, if a unit cell is not selected in response to a transmission signal regardless of a voltage level of a selection signal Sx, a conversion voltage of the unit cell is not output any more.

Accordingly, it is possible for the selection signals to be concurrently enabled in units of line like the reset signal Rx. Alternatively, it is possible for all the selection signals Sx to be combined into a single selection signal.

FIG. 8 is a schematic diagram illustrating an image sensor according to a first embodiment of the present invention.

Referring to FIG. 8, in the image sensor, a plurality of 3T-4S step & repeat unit cells 300 and 400 illustrated in FIGS. 3 and 4 are two-dimensionally arranged. Conversion voltages are output through a first common detection line OUT1 passing through 3T-4S step & repeat unit cells 300 and 400 and a second common detection line OUT2 arranged in the right side of the first common detection line OUT1. Conversion voltages obtained from a vertically arranged plurality of unit cells 801 to 803 are output through the first and second common detection lines OUT1 and OUT2. Conversion voltages obtained from a vertically arranged plurality of unit cells 811 to 813 are output through third and fourth common detection lines OUT3 and OUT4. Conversion voltages obtained from a vertically arranged plurality of unit cells 821 to 823 are output through fifth and sixth common detection lines OUT5 and OUT6.

Conversion voltages for image signals incident onto two photodiodes G among four photodiodes constituting the unit cells 801 to 803 are output through the second common detection line OUT2. Conversion voltages for image signals incident onto the other two photodiodes B and R are output through the first common detection line OUT1. Here, photodiodes denoted by G indicate photodiodes that receive green components via green filters formed on the photodiodes.

Similarly, photodiodes denoted by B and R indicate photodiodes that receive blue and red components via blue and red filters formed on the photodiodes, respectively.

Referring to FIG. 8, conversion voltages for image signals incident onto photodiodes via blue and red filters are output through odd-numbered common detection lines OUT1, OUT3, and OUT5. Conversion voltages for image signals incident onto photodiodes via green filters are output through even-numbered common detection lines OUT2, OUT4, and OUT6. However, this is an example of a layout. It is possible to oppositely connect the common detection lines.

Although in FIG. 8, conversion voltages are output through common detection lines arranged in the right side of unit cells, it is possible for the conversion voltages to be output through common detection lines arranged in the left side of the unit cells.

Although in FIG. 8, a common detection line is vertically arranged between neighboring photodiodes. It is also possible two common detection lines to be vertically arranged between neighboring pairs of photodiodes.

FIG. 9 is a schematic diagram illustrating an image sensor according to a second embodiment of the present invention.

Referring to FIG. 9, conversion voltages are output through two common detection lines arranged on both sides of 3T-4S step & repeat unit cells 500 and 600 illustrated in FIGS. 5 and 6. Conversion voltages obtained from a vertically arranged plurality of unit cells 901 to 903 are output through first and second common detection lines OUT1 and OUT2. Conversion voltages obtained from a vertically arranged plurality of unit cells 911 to 913 are output through third and fourth common detection lines OUT3 and OUT4. Conversion voltages obtained from a vertically arranged plurality of unit cells 921 to 923 are output through fifth and sixth common detection lines OUT5 and OUT6.

The plurality of unit cells 901 to 903 are arranged between the first and second common detection lines OUT1 and OUT2. Conversion voltages corresponding to image signals incident onto two photodiodes G among four photodiodes included in each unit cell are output through the first common detection line OUT1. Conversion voltages corresponding to image signals incident onto the other two photodiodes B and R are output through the second common detection line OUT2.

Accordingly, only conversion voltages for image signals incident via green filters in the three unit cells 901 to 903 are output through the first common detection line OUT1. Only conversion voltages for image signals incident via blue and red filters in the three unit cells 901 to 903 are output through the second common detection line OUT2.

Similarly, only conversion voltages for image signals incident via green filters in the three unit cells 911 to 913 are output through the third common detection line OUT3. Only conversion voltages for image signals incident via blue and red filters in the three unit cells 911 to 913 are output through the fourth common detection line OUT4. The fifth and sixth common detection lines OUT5 and OUT6 operate in a similar manner.

Only conversion voltages for image signals incident via green filters are output through odd-numbered common detection lines OUT1, OUT3, and OUT5, and only conversion voltages for image signals incident via blue and red filters are output through even-numbered common detection lines OUT2, OUT4, and OUT6. It is possible to oppositely connect the common detection lines.

FIG. 10 is a schematic diagram illustrating an image sensor according to a third embodiment of the present invention.

FIG. 11 is a schematic diagram illustrating an image sensor according to a fourth embodiment of the present invention.

Referring to FIGS. 10 and 11, conversion voltages are output through two common detection lines that are vertically arranged at a side of the 3T-4S step & repeat unit cells 500 and 600 illustrated in FIGS. 5 and 6. In FIG. 10, two common detection lines are arranged in the right side of the unit cells 500 and 600. Unlike FIG. 10, in FIG. 11, two common detection lines are arranged in the left side of the unit cells 500 and 600.

However, in FIGS. 10 and 11, conversion voltages corresponding to image signals incident via green filters are output through odd-numbered common detection lines OUT1, OUT3, and OUT5, and conversion voltages corresponding to image signals incident via blue and red filters are output through even-numbered common detection lines OUT2, OUT4, and OUT6. Here, characteristics of the conversion voltages that are output through the odd-numbered common detection lines and characteristics of the conversion voltages that are output through the even-numbered common detection lines may be exchanged with each other.

FIG. 12 is a practical circuit diagram illustrating the image sensor shown in FIG. 8.

Referring to FIG. 12, conversion voltages for image signals incident via blue and red filters are output through a common detection line OUT1 passing through the 3T-4S step & repeat unit cell (inside of a dotted line), and conversion voltages for image signals incident via green filters are output through a common detection line OUT2 arranged at the light side of the 3T-4S step & repeat unit cell (inside of the dotted line) are output.

For the convenience of understanding, operations in response to second and third transmission signals Tx1 and Tx2 will be described based on that the image sensor operates in response to a first transmission signal Tx0 with respect to a zeroth line. Here, transmission signals Tx, reset signals Rx, and selection signals Sx are output from a transmission signal driving device Tx_Drv, a reset signal driving device Rx_Drv, and a selection signal driving device Sx_Drv, respectively. This will be applied to the following drawings.

Conversion voltages for image signals incident onto four photodiodes (1, 1) to (1, 4) arranged in a first line are output through four common detection lines OUT1 to OUT4 in response to the second transmission signal Tx1, a 01-reset signal Rx01, and a selection signal Sx, respectively. That is, conversion voltages for image signals incident onto two photodiodes (1, 2) and (1, 4) via green filters are output through even-numbered common detection lines OUT2 and OUT4, respectively. Conversion voltages for image signals incident onto two photodiodes (1, 1) and (1, 3) via red filters are output through odd-numbered common detection lines OUT1 and OUT3.

Conversion voltages for image signals incident onto four photodiodes (2, 0) to (2, 3) arranged in a second line are output through four common detection lines OUT1 to OUT4 in response to the third transmission signal Tx2, a 12-reset signal RX12, and the selection signal Sx, respectively. That is, conversion voltages for image signals incident onto two photodiodes (2, 0) and (2, 2) via blue filters are output through the odd-numbered common detection lines OUT1 and OUT3, respectively. Conversion voltages for image signals incident onto two photodiodes (2, 1) and (2, 3) via green filters are output through the even-numbered common detection lines OUT2 and OUT4, respectively.

If the aforementioned description is applied to the other lines, the conclusion is as follows. Conversion voltages for image signals incident via green filters are output through even-numbered common detection lines. Conversion voltages for image signals incident via blue and red filters are output through odd-numbered common detection lines.

Although in FIG. 12, the conversion voltages for the image signals incident via the green filters are output through the even-numbered common detection lines, and the conversion voltages for the image signals incident via the blue and red filters are output through the odd-numbered common detection lines, it is possible to oppositely connect the common detection lines.

Latches and switches denoted by rectangles shown in FIG. 12 are components of the image sensor. Since the operations of the latches and the switches are well known, description on the latches and the switches will be omitted.

FIG. 13 illustrates an application of the image sensor shown in HG. 8.

Referring to FIG. 13, two common detection lines OUT1 and OUT2 pass through the 3T-4S step & repeat unit cell (inside of a dotted line). Conversion voltages for image signals incident via blue and red filters are output through a first common detection line OUT1 that is a left common detection line of the two common detection lines OUT1 and OUT2. Conversion voltages for image signals incident via green filters are output through a second common detection line OUT2 that is a right common detection line of the two common detection line OUT1 and OUT2.

FIG. 12 is different from FIG. 13 in positions of conversion transistors. The common detection lines shown in FIG. 13 are obtained by shifting the common detection lines shown in FIG. 12 by one photodiode in the left direction of the photodiodes. FIG. 12 is the same as FIG. 13 in that common detection lines for outputting conversion voltages for image signals incident onto photodiodes via green filters and common detection lines for outputting conversion voltages for image signals incident onto photodiodes via blue and red filters are separately and alternately arranged.

FIG. 14 is a practical circuit diagram illustrating the image sensor shown in FIG. 9.

Referring to FIG. 14, conversion voltages are output through two common detection lines arranged on both sides of the 3T-4S step & repeat unit cells (inside of a dotted line).

When a first transmission signal Tx0 is enabled, conversion voltages for image signals incident onto three photodiodes (0, 1), (0, 3), and (0, 5) via green filters are output through odd-numbered common detection lines OUT1, OUT3, and OUT5, and conversion voltages for image signals incident onto three photodiodes (0, 0), (0, 2), and (0, 4) via blue filters are output through even-numbered common detection lines OUT2, OUT4, and OUT6.

When a second transmission signal Tx1 is enabled, conversion voltages for image signals incident onto three photodiodes (1, 0), (1, 2), and (1, 4) via green filters are output through the odd-numbered common detection lines OUT1, OUT3, and OUT5, and conversion voltages for image signals incident onto three photodiodes (1, 1), (1, 3), and (1, 5) via red filters are output through the even-numbered common detection lines OUT2, OUT4, and OUT6.

If transmission signals are applied in any order, conversion voltages for image signals incident via green filters are output through odd-numbered common detection lines, and conversion voltages for image signals incident via blue and red filters are output through even-numbered common detection lines.

FIG. 15 is a practical circuit diagram illustrating the image sensor shown in FIG. 10.

Referring to FIG. 15, conversion voltages are output through two common detection lines arranged in the right side of the 3T-4S step & repeat unit cells (inside of a dotted line). Unlike FIG. 15, in FIG. 14, conversion voltages are output through two common detection lines arranged on both sides of the 3T-4S step & repeat unit cells (inside of the dotted line).

When a first transmission signal Tx0 is enabled, conversion voltages for image signals incident onto three photodiodes (0, 0), (0, 2), and (0, 4) via blue filters are output through odd-numbered common detection lines OUT1, OUT3, and OUT5, and conversion voltages for image signals incident onto three photodiodes (0, 1), (0, 3), and (0, 5) via green filters are output through even-numbered common detection lines OUT2, OUT4, and OUT6.

When a second transmission signal Tx1 is enabled, conversion voltages for image signals incident onto three photodiodes (1, 1), (1, 3), and (1, 5) via red filters are output through the odd-numbered common detection lines OUT1, OUT3, and OUT5, and conversion voltages for image signals incident onto three photodiodes (1, 0), (1, 2), and (1, 4) via green filters are output through the even-numbered common detection lines OUT2, OUT4, and OUT6.

If transmission signals are applied in any order, conversion voltages for image signals incident via green filters are output through even-numbered common detection lines, and conversion voltages for image signals incident via blue and red filters are output through odd-numbered common detection lines.

As described above, it is advantageous to process signals that are output through dedicated common detection lines by distinguishing common detection lines dedicated to output image signals incident via green filters from common detection lines dedicated to output image signals incident via blue and red filters. In general, conversion voltages corresponding to image signals incident through the green filters and conversion voltages corresponding image signals incident through the blue and red filters are separately processed. In a conventional case, since all the conversion voltages for image signals incident through three types of filters are output through a single common detection line, a unit for classifying the conversion voltages is required. According to recent technical trends for reducing an area of the entire system by reducing an area of peripheral circuits, the aforementioned unit decreases competitive power of the system.

The 3T-4S image sensor including 3T-4S step & repeat unit cells according to an embodiment of the present invention does not require the additional unit for classifying conversion voltages for image signals incident through three types of filters.

While the present invention has been particularly shown and described with reference to exemplary embodiments thereof, it will be understood by those skilled in the art that various changes in form and details may be made therein without departing from the spirit and scope of the present invention as defined by the appended claims.

Industrial Applicability

As described above, in regard to the 3T-4S step & repeat unit cell and the image sensor including the 3T-4S step & repeat unit cell, it is possible to conveniently lay out a two-dimensional image sensor by using the 3T-4S step & repeat unit cell by combining four image sensor unit cells each including three transistors into a single 3T-4S step & repeat unit cell and to simply and rapidly process signals by distinguishing common detection lines dedicated to output image signals incident via green filters from common detection lines dedicated to output image signals incident via blue and red filters.

The invention claimed is:

1. A 3T-4S step & repeat unit cell comprising:
a first photodiode $(0, 0)$;
a second photodiode $(1, 1)$ disposed in a diagonal direction of the first photodiode;
a third photodiode $(1, 2)$ disposed at a side of the second photodiode; and
a fourth photodiode $(2, 1)$ disposed over the second photodiode,
wherein a first shared image sensor unit cell is constructed by combining the first and second photodiodes with four transistors, and a second shared image sensor unit cell is constructed by combining the third and fourth photodiodes with four transistors, and
wherein signals corresponding to images incident onto the first and second photodiodes are output through a first common detection line OUT1, signals corresponding to images incident onto the third and fourth photodiodes are output through a second common detection line OUT2, and a terminal of each of the four photodiodes is connected to a first voltage source.

2. The 3T-4S step & repeat unit cell of claim 1, wherein the first shared image sensor unit cell includes:
a first transmission transistor M1 including a terminal connected to the other terminal of the first photodiode $(0, 0)$ and a gate applied with a first transmission signal Tx0;
a second transmission transistor M2 including a terminal connected to the other terminal of the second photodiode $(1, 1)$ and a gate applied with a second transmission signal Tx1;
a first reset transistor M3 including a terminal connected to a common node FDnode01 of the other terminal of the first transmission transistor M1 and the other terminal of the second transmission transistor M2, the other terminal connected to a selection signal Sx, and a gate applied with a 01-reset signal Rx01; and
a first conversion transistor M4 including a terminal connected to the selection signal Sx or the second voltage source Vdd, the other terminal connected to the first common detection line OUT1, and a gate the common node FDnode01 of the other terminal of the first transmission transistor and the other terminal of the second transmission transistor.

3. The 3T-4S step & repeat unit cell of claim 2, wherein the second shared image sensor unit cell includes:
a third transmission transistor M5 including a terminal connected to the other terminal of the third photodiode $(1, 2)$ and a gate applied with a second transmission signal Tx1;
a fourth transmission transistor M6 including a terminal connected to the other terminal of the fourth photodiode $(2, 1)$ and a gate applied with a third transmission signal Tx2;
a second reset transistor M7 including a terminal connected to a common node FDnode12 of the other terminal of the third transmission transistor M5 and the other terminal of the fourth transmission transistor M6 and the other terminal connected to a selection signal Sx; and
a second conversion transistor M8 including a terminal connected to the selection signal Sx or the second voltage source Vdd, the other terminal connected to the second common detection line OUT2, and a gate connected to the common node FDnode12 of the other terminal of the third transmission transistor M5 and the other terminal of the fourth transmission transistor M6.

4. The 3T-4S step & repeat unit cell of claim 1,
wherein when the first and second photodiodes $(0, 0)$ and $(1, 1)$ operate in response to image signals incident via a first filter, the third and fourth photodiodes $(1, 2)$ and $(2, 1)$ operate in response to image signals incident respectively via second and third filters, and
wherein when the third and fourth photodiodes $(1, 2)$ and $(2, 1)$ operate in response to the image signals incident via the first filter, the first and second photodiodes $(0, 0)$ and $(1, 1)$ operate in response to image signals incident respectively via the second and third filters.

5. The 3T-4S step & repeat unit cell of claim 4, wherein the first filter is a green filter, and each of the second and third filters is a red or blue filter.

6. The 3T-4S step & repeat unit cell of claim 3,
wherein the 01-reset signal Rx01 is enabled respectively in relation to the first and second transmission signals Tx0 and Tx1,
wherein the 12-reset signal Rx12 is enabled respectively in relation to the second and third transmission signals Tx1 and Tx2, and wherein the selection signal Sx01 is enabled respectively in relation to the first to third transmission signals Tx0 to Tx3.

7. A 3T-4S image sensor in which a plurality of the 3T-4S step & repeat unit cells of claim 1 are two-dimensionally arranged,
wherein a plurality of common detection lines are vertically or horizontally arranged between neighboring 3T-4S step & repeat unit cells among the two-dimensionally arranged plurality of 3T-4S step & repeat unit cells, and
wherein the plurality of 3T-4S step & repeat unit cells arranged along the plurality of common detection lines output conversion voltages corresponding to image signals incident onto photodiodes through two neighboring common detection lines.

8. The 3T-4S image sensor of claim 7, wherein each of the 3T-4S step & repeat unit cells outputs conversion voltages corresponding to image signals incident onto two photodiodes via green filters through a single common detection line and outputs conversion voltages corresponding to images signals incident onto another two photodiodes via red and blue filters through another single common detection line.

9. The 3T-4S image sensor of claim 8, wherein one of the two neighboring common detection lines passes through the two-dimensionally arranged plurality of 3T-4S step & repeat unit cells, and the other of the two neighboring common detection lines is disposed near the unit cells.

10. The 3T-4S image sensor of claim 9, wherein common detection lines through which conversion voltages generated in correspondence with image signals incident via green filters are output and common detection lines through which conversion voltages generated in correspondence with image signals incident via red and blue filters are output are alternately arranged.

11. A 3T-4S step & repeat unit cell comprising:
a first photodiode (0, 0);
a second photodiode (1, 0) disposed over the first photodiode;
a third photodiode (1, 1) disposed at a side of the second photodiode; and
a fourth photodiode (2, 1) disposed over the third photodiode,
wherein a first shared image sensor unit cell is constructed by combining the first and third photodiodes (0, 0) and (1, 1) with four transistors, and a second shared image sensor unit cell is constructed by combining the second and fourth photodiodes (1, 0) and (2, 1) with four transistors, and
wherein signals corresponding to images incident onto the second and fourth photodiodes (1, 0) and (2, 1) are output through a first common detection line OUT1, signals corresponding to images incident onto the first and third photodiodes (0, 0) and (1, 1) are output through a second common detection line OUT2, and a terminal of each of the four photodiodes is connected to a first voltage source.

12. The 3T-4S step & repeat unit cell of claim 11, wherein the first shared image sensor unit cell includes:
a first transmission transistor M1 including a terminal connected to the other terminal of the first photodiode and a gate applied with a first transmission signal Tx0;
a second transmission transistor M2 including a terminal connected to the other terminal of the third photodiode and a gate applied with a second transmission signal Tx1;

a first reset transistor M3 including a terminal connected to a common node FDnode01 of the other terminal of the first transmission transistor and the other terminal of the second transmission transistor, the other terminal connected to a selection signal Sx, and a gate applied with a 01-reset signal Rx01; and
a first conversion transistor M4 including a terminal connected to the selection signal Sx or the second voltage source Vdd and a gate connected to the common node FDnode01 of the other terminal of the first transmission transistor and the other terminal of the second transmission transistor.

13. The 3T-4S step & repeat unit cell of claim 12, wherein the second shared image sensor unit cell includes:
a third transmission transistor M5 including a terminal connected to the other terminal of the second photodiode and a gate applied with a second transmission signal Tx1;
a fourth transmission transistor M6 including a terminal connected to the other terminal of the fourth photodiode and a gate applied with a third transmission signal Tx2;
a second reset transistor M7 including a terminal connected to a common node FDnode12 of the other terminal of the third transmission transistor M5 and the other terminal of the fourth transmission transistor M6 and the other terminal connected to a selection signal Sx; and
a second conversion transistor M8 including a terminal connected to the selection signal Sx or the second voltage source Vdd and a gate connected to the common node FDnode12 of the other terminal of the third transmission transistor M5 and the other terminal of the fourth transmission transistor M6.

14. The 3T-4S step & repeat unit cell of claim 11,
wherein when the first and third photodiodes (0, 0) and (1, 1) operate in response to image signals incident via a first filter, the second and fourth photodiodes (1, 0) and (2, 1) operate in response to image signals incident respectively via second and third filters, and
wherein when the second and fourth photodiodes (1, 0) and (2, 1) operate in response to the image signals incident via the first filter, the first and third photodiodes (0, 0) and (1, 1) operate in response to image signals incident respectively via the second and third filters.

15. The 3T-4S step & repeat unit cell of claim 13,
wherein the 01-reset signal Rx01 is enabled respectively in relation to the first and second transmission signals Tx0 and Tx1,
wherein the 12-reset signal Rx12 is enabled respectively in relation to the second and third transmission signals Tx1 and Tx2, and
wherein the 01-selection signal Sx01 is enabled respectively in relation to the first to third transmission signals Tx0 to Tx2.

16. A 3T-4S image sensor in which a plurality of the 3T-4S step & repeat unit cells of claim 12 are two-dimensionally arranged,
wherein a plurality of common detection lines are vertically or horizontally arranged between neighboring 3T-4S step & repeat unit cells among the two-dimensionally arranged plurality of 3T-4S step & repeat unit cells, and
wherein the plurality of 3T-4S step & repeat unit cells arranged along the plurality of common detection lines output conversion voltages corresponding to image signals incident onto photodiodes through two neighboring common detection lines.

17. The 3T-4S image sensor of claim 16, wherein each of the 3T-4S step & repeat unit cells outputs conversion voltages corresponding to image signals incident onto two photodiodes via green filters through a single common detection line and outputs conversion voltages corresponding to images signals incident onto another two photodiodes via red and blue filters through another single common detection line.

18. The 3T-4S image sensor of claim 17, wherein common detection lines through which conversion voltages generated in correspondence with image signals incident via green filters are output and common detection lines through which conversion voltages generated in correspondence with image signals incident via red and blue filters are output are alternately arranged.

19. The 3T-4S image sensor of claim 16,
wherein two common detection lines are arranged on the outermost sides of the two-dimensionally arranged plurality of 3T-4S step & repeat unit cells, two common detection lines are arranged between neighboring 3T-4S step & repeat unit cells among the plurality of 3T-4S step & repeat unit cells, and
wherein in regard to two common detection lines arranged on both sides of each 3T-4S step & repeat unit cell, conversion voltages corresponding to image signals incident via green filters are output through a common detection line arranged on a side of each 3T-4S step & repeat unit cell, and conversion voltages corresponding to image signals incident via red and blue filters are output through the other common detection line arranged on the other side of each 3T-4S step & repeat unit cell.

20. The 3T-4S image sensor of claim 16,
wherein no common detection line is arranged in an outermost side of the two-dimensionally arranged plurality of 3T-4S step & repeat unit cells, and two common detection lines are arranged in the other outermost side of the two-dimensionally arranged plurality of 3T-4S step & repeat unit cells and between neighboring 3T-4S step & repeat unit cells, and
wherein conversion voltages generated in correspondence with image signals incident via green filters are output through one common detection line of the two common detection lines arranged in one side of the 3T-4S step & repeat unit cells, and conversion voltages generated in correspondence with image signals incident via red and blue filters are output through the other common detection line of the two common detection lines.

* * * * *